(12) United States Patent
Kirkland et al.

(10) Patent No.: US 6,229,345 B1
(45) Date of Patent: May 8, 2001

(54) HIGH SPEED CHARGE-PUMP

(75) Inventors: Brian Kirkland; Nathan Y. Moyal, both of Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/396,344

(22) Filed: Sep. 15, 1999

(51) Int. Cl.[7] .................................................. H03K 5/22
(52) U.S. Cl. .................................................. 327/65; 327/69
(58) Field of Search ........................... 330/260, 265; 331/17, 25, DIG. 2; 327/148, 157, 156, 536, 558, 407, 409, 415, 417, 54, 65, 67, 69

(56) References Cited

U.S. PATENT DOCUMENTS

| | | |
|---|---|---|
| 5,164,685 | * 11/1992 | Niemio ........................ 331/8 |
| 5,239,455 | 8/1993 | Fobbester et al. ............ 363/60 |
| 5,332,930 | * 7/1994 | Volk ........................... 307/270 |
| 5,343,167 | * 8/1994 | Masumoto et al. ............ 331/2 |
| 5,625,306 | 4/1997 | Tada ........................... 327/112 |
| 5,663,686 | 9/1997 | Tada ........................... 331/8 |
| 5,699,016 | * 12/1997 | Federspiel et al. ........... 330/260 |
| 5,734,279 | 3/1998 | Bereza ......................... 327/112 |
| 5,801,578 | 9/1998 | Bereza ......................... 327/536 |
| 5,825,640 | 10/1998 | Quigley et al. ............... 363/60 |
| 6,084,479 | * 7/2000 | Duffy et al. .................. 331/17 |

* cited by examiner

*Primary Examiner*—Jung Ho Kim
(74) *Attorney, Agent, or Firm*—Christopher P. Maiorana, P.C.

(57) ABSTRACT

An apparatus comprising a first circuit, a second circuit and a third circuit. The first circuit may be configured to generate a first current in response to a first input signal. The second circuit may be configured to generate a second current in response to a second input signal. The third circuit may be configured to present a first pulse of current at a first output or a second pulse of current at a second output in response to the first and second currents.

18 Claims, 6 Drawing Sheets

HIGH SPEED CHARGE-PUMP

CROSS REFERENCE TO RELATED APPLICATIONS

The present application may relate to co-pending application Ser. No. 09/232,344 filed Jan. 15, 1999, which is hereby incorporated by reference in its entirety.

FIELD OF THE INVENTION

The present invention relates to a charge-pump circuit generally and, more particularly, to a circuit configured to generate pulses of current which are injected into a subsequent loop filter in a PLL system.

BACKGROUND OF THE INVENTION

Many conventional charge pumps circuits are push-pull style tri-stating charge pumps which have trouble operating at very high speeds. Push-pull style charge-pumps rely on precise matching between pull-up and pull-down currents. Furthermore, the PMOS transistors frequently used in pull-up stages are slow and thus limit the speed of operation. Previous charge-pump circuits also require extra circuitry to maintain an adequate common mode at the charge-pump outputs.

FIG. 1 illustrates one conventional charge-pump circuit 10. The charge-pump circuit 10 requires a separate multiplexer 12. The circuit 10 is limited to the use of the multiplexer 12.

FIG. 2 illustrates a conventional charge-pump circuit that can be found in U.S. Pat. No. 5,825,640. The push-pull style of charge-pump circuit of FIG. 2 relies on precise matching between pull-up and pull-down currents. The circuit is limited to the speed of PMOS transistor MP used in the pull-up stage. Furthermore the conventional charge-pump shown requires extra circuitry to maintain an adequate common mode at the charge-pump output.

FIG. 3 illustrates a conventional charge-pump circuit that can be found in U.S. Pat. No. 5,734,279. The circuit of FIG. 3, similar to the circuit of FIG. 2, is limited to the speed of PMOS transistors M1 and M2 used in the pull-up stage. Furthermore, the conventional charge-pump shown requires extra circuitry to maintain an adequate common mode at the charge-pump output.

FIG. 4 illustrates a conventional charge-pump circuit that can be found in U.S. Pat. No. 5,734,279. The circuit of FIG. 4, similar to the circuits of FIG. 2 and FIG. 3, is limited to the speed of PMOS transistors M9–M10 used in the pull-up stage. Furthermore the conventional charge-pump shown requires extra circuitry to maintain an adequate common mode at the charge-pump output.

FIG. 5 illustrates a conventional charge-pump circuit that can be found in U.S. Pat. No. 5,239,455.

FIG. 6 illustrates a conventional charge-pump circuit that can be found in U.S. Pat. No. 5,663,686. The circuit of FIG. 6 requires extra circuitry to maintain an adequate common mode at the charge-pump output and precise matching between pull-up and pull-down currents. It also is very sensitive to the matching of CMOS transmission gate impedances.

FIG. 7 illustrates a conventional charge-pump circuit that can be found in U.S. Pat. No. 5,625,306. The circuit of FIG. 7, similar to the circuit of FIG. 6, requires extra circuitry to maintain an adequate common mode at the charge-pump output and precise matching between pull-up and pull-down currents.

SUMMARY OF THE INVENTION

The present invention concerns an apparatus comprising a first circuit, a second circuit and a third circuit. The first circuit may be configured to generate a first current in response to a first input signal. The second circuit may be configured to generate a second current in response to a second input signal. The third circuit may be configured to present a first pulse of current at a first output or a second pulse of current at a second output in response to the first and second currents.

The objects, features and advantages of the present invention include implementing a charge-pump that may generate pulses of current that may (i) provide a higher operational speed, (ii) have more linear transfer function, (iii) provide matching pull-up and pull-down currents, (iv) implement an integrated multiplexer, (v) eliminate and/or reduce the need for common mode circuitry, (vi) have smaller input swings, and/or (vii) provide faster multiplexing operation.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
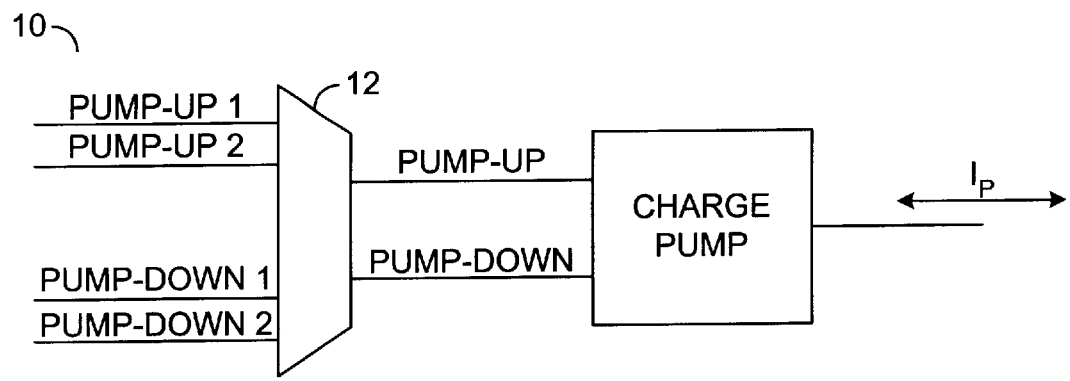
FIG. 1 is a block diagram of a conventional charge pump circuit.
Figure 2:
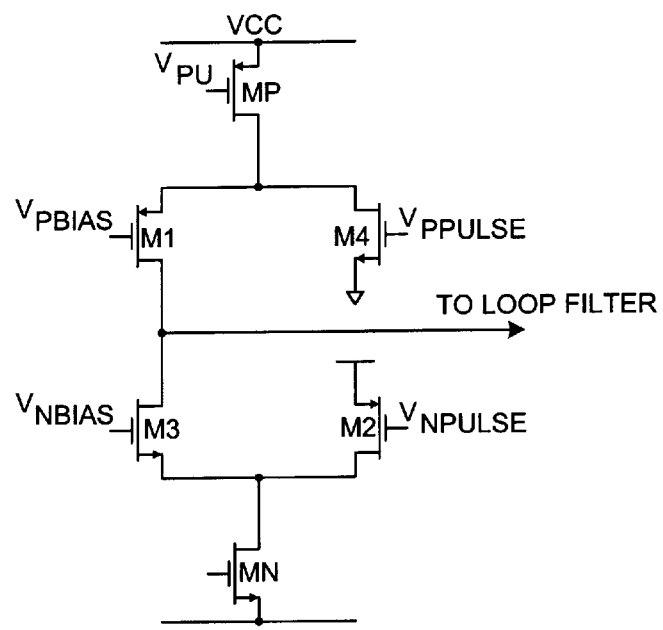
FIG. 2 is a circuit diagram of a conventional charge pump.
Figure 3:
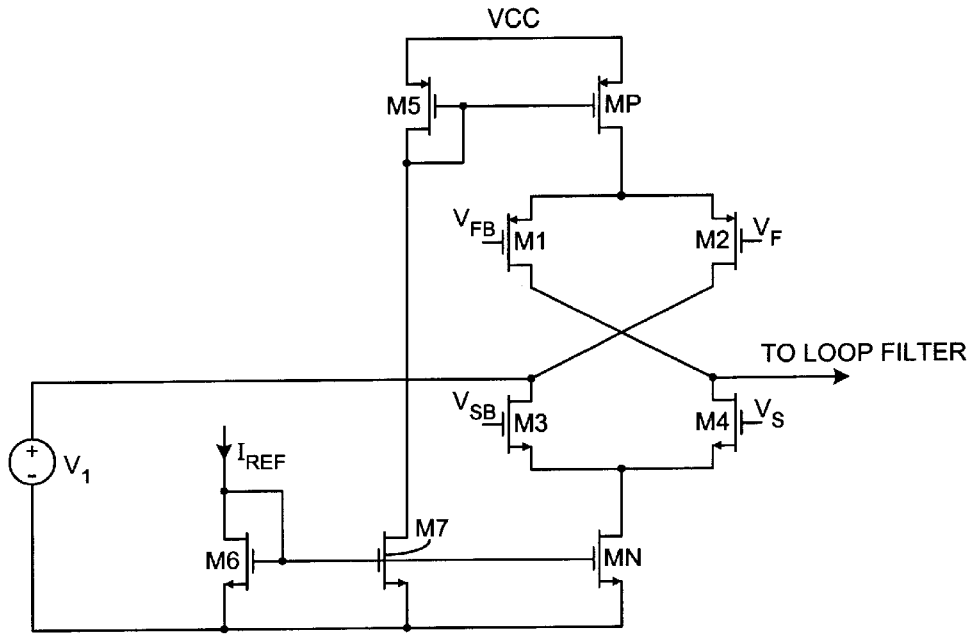
FIG. 3 is a circuit diagram of a conventional charge pump.
Figure 4:
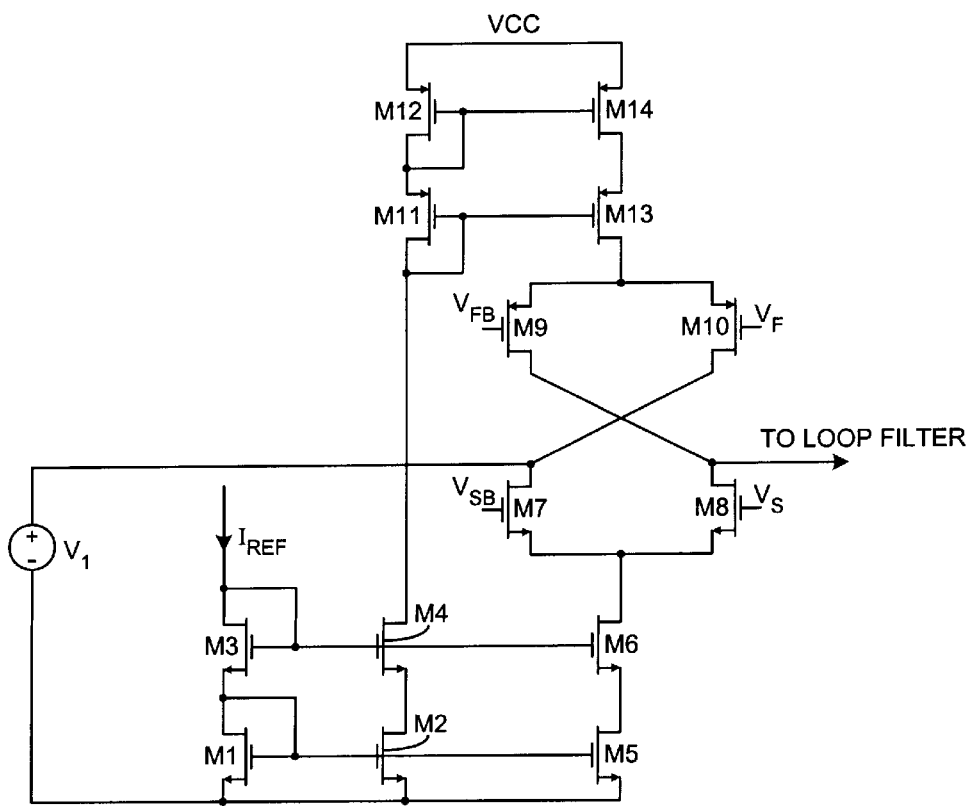
FIG. 4 is a circuit diagram of a conventional charge pump.
Figure 5:
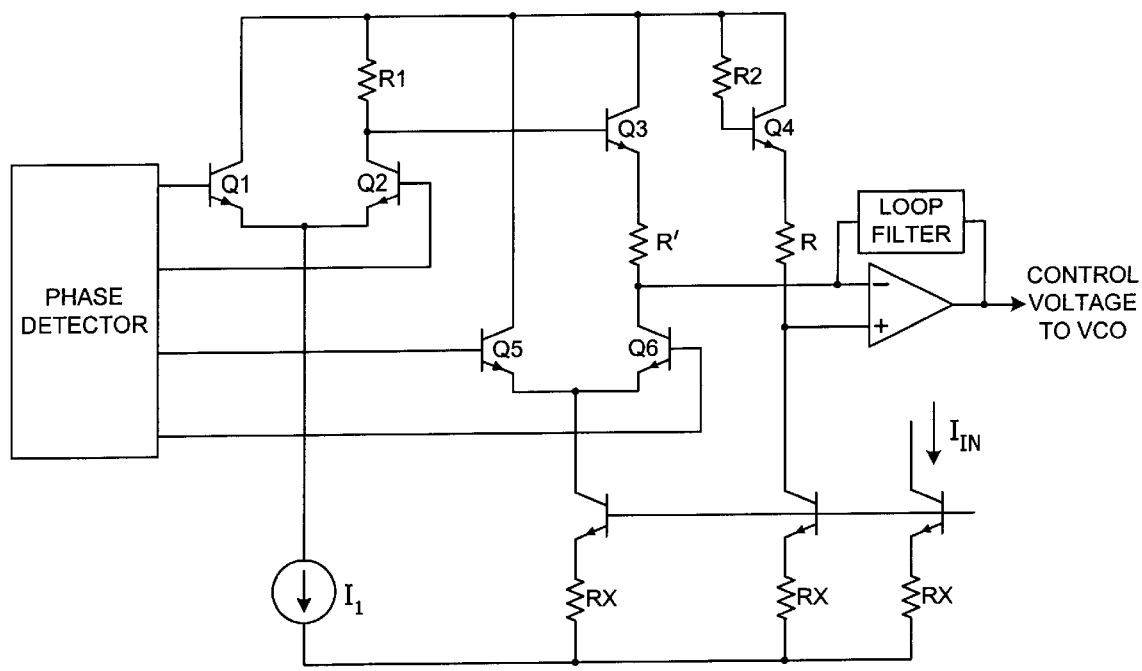
FIG. 5 is a circuit diagram of a conventional charge pump.
Figure 6:
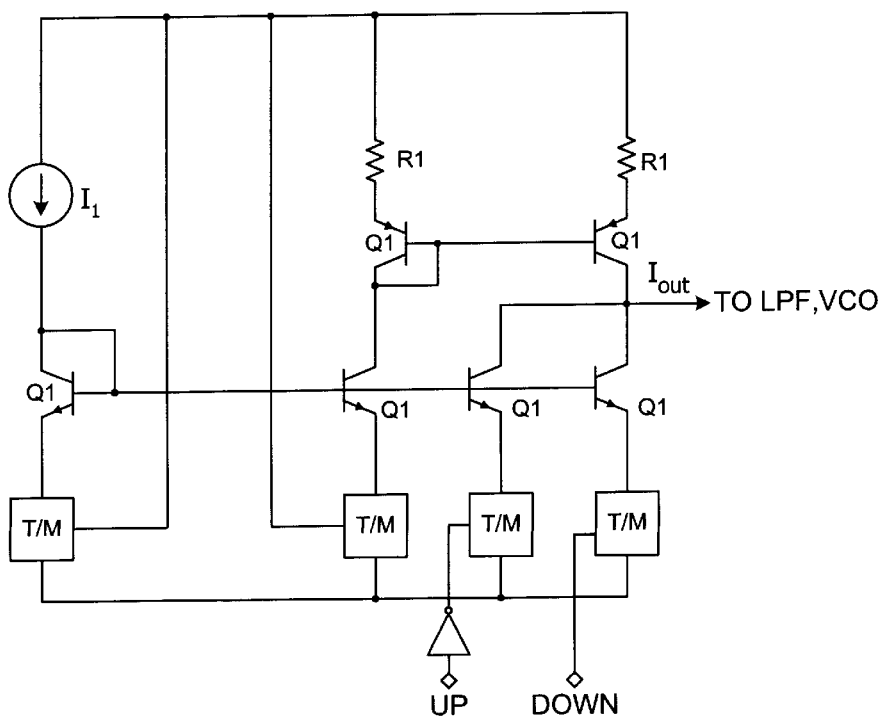
FIG. 6 is a circuit diagram of a conventional charge pump.
Figure 7:
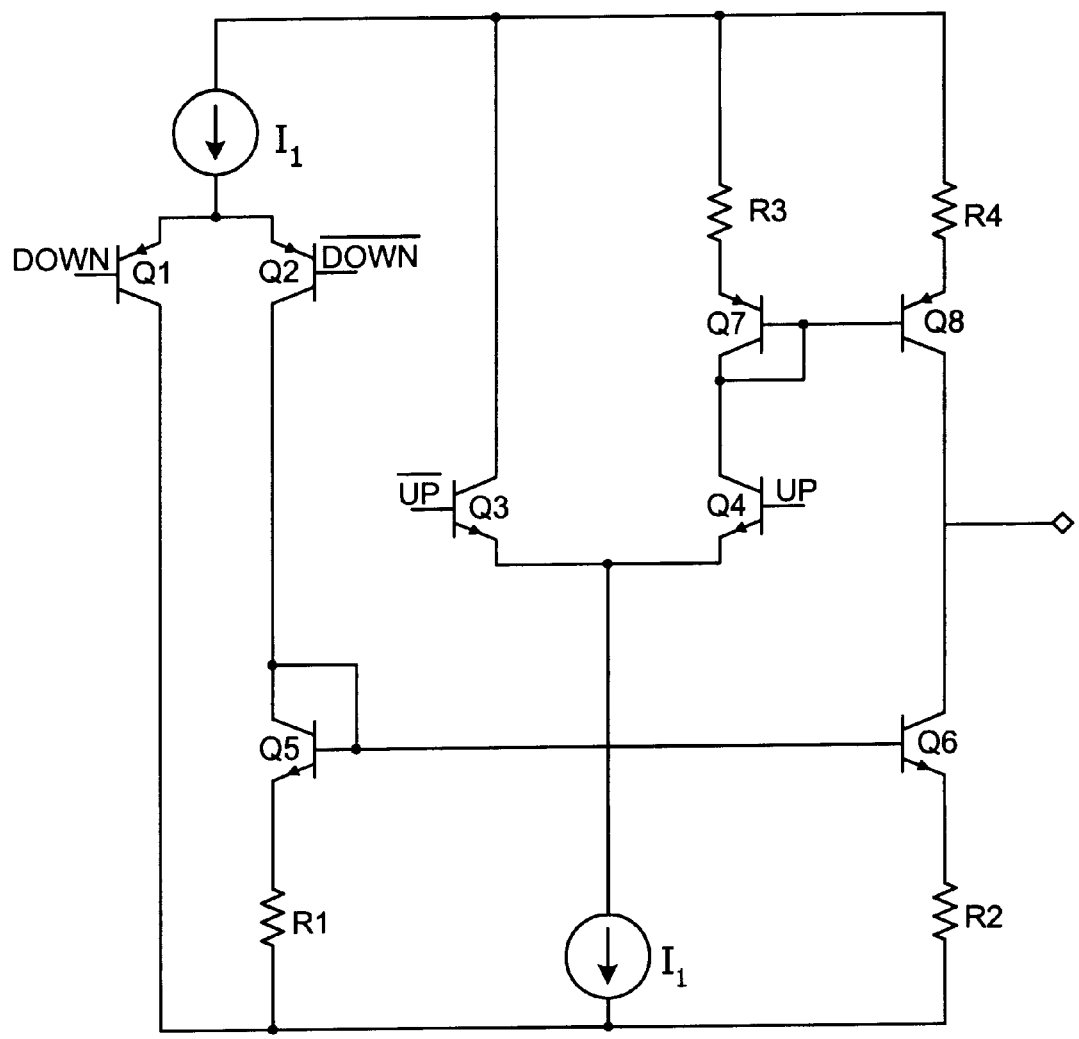
FIG. 7 is a circuit diagram of a conventional charge pump.
Figure 8:
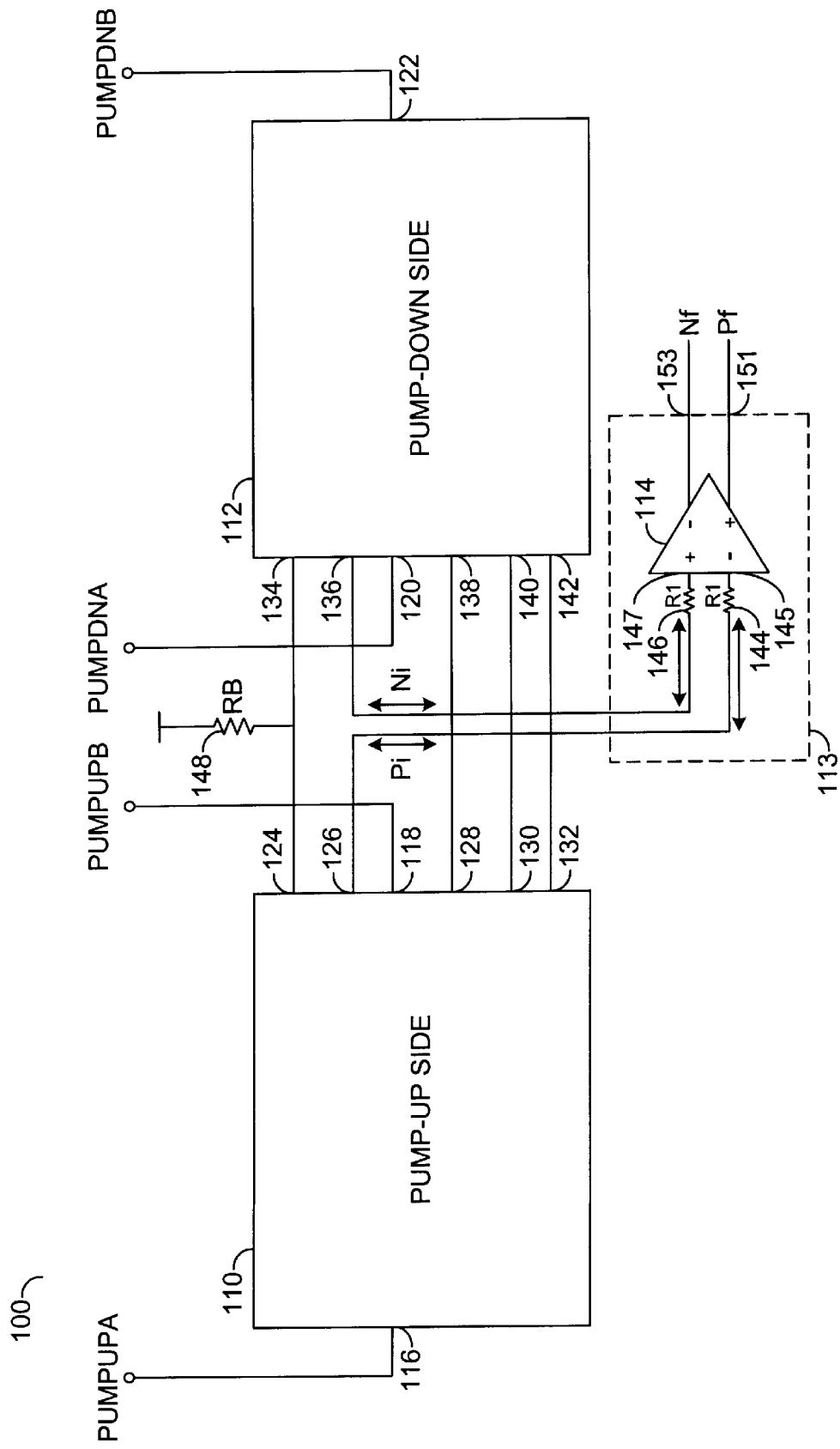
FIG. 8 is a block diagram of a preferred embodiment of the present invention.

Referring to FIG. 8, a block diagram of a circuit 100 is shown in accordance with a preferred embodiment of the present invention. The circuit 100 may generate pulses of current which may be injected into, for example, a loop filter in a PLL system. The circuit 100 may have a positive pair and a negative pair of inputs that receive pulse-width modulated logic signals.

The positive pair may comprise a signal (e.g., a pump-up signal PUMPUPA) and second signal (e.g., a pump-up signal PUMPUPB). The negative pair may comprise a signal (e.g., a pump-down signal PUMPDNA) and a signal (e.g., a pump-down signal PUMPDNB).

The circuit 100 generally comprises a pump-up circuit 110, a pump-down circuit 112 and an output circuit 113. The output circuit 113 may comprise a comparator 114. The comparator 114 may be implemented, in one example, as an operational amplifier. The pump-up circuit 110 may have an input 116 configured to receive the signal PUMPUPA and an input 118 configured to receive the signal PUMPUPB. The pump-down circuit 112 may have an input 120 configured to receive the signal PUMPDNA and an input 122 configured to receive the signal PUMPDNB. Only one of the pump-up or pump-down inputs is generally active at one time, allowing the circuit 100 to be used in applications requiring two phase detectors or two phase/frequency detectors.

The circuit 100 may generate a first and second pulse of current in response to the pump-up and pump-down differential inputs and the comparator 113. The circuit 100 may be used for high speed operation of the inputs (e.g., 116, 118, 120 and 122) and the outputs (e.g., 126 and 136).

The pump-up circuit 110 may receive a supply voltage at an input 124, through a resistor 148. The pump-down circuit 112 may receive the supply voltage at an input 134, through the resistor 148. The output 126 of the pump-up circuit 110 may be connected, through a resistor 144, to a first input 145 of the comparator 114. The output 136 of the pump-down circuit 112 may be connected, through a resistor 146, to a second input 147 of the comparator 142.

The pump-up circuit 110 may provide an initial positive current (e.g., positive current Pi) at the input/output 126. This will generally cause a negative current at the output 136. The pump-down circuit 112 may provide an initial positive current at the input/output 136. This will generally cause a negative current at the output 126. The output circuit 113 generally presents the first current (e.g., positive current Pf) at an output 151. The output circuit 113 generally presents the second current (e.g., negative current Nf) at an output 153. The comparator 114 generally presents the first and second currents Pf and Nf in 5 response to the initial positive current Pi and the initial negative current Ni.

Figure 9:
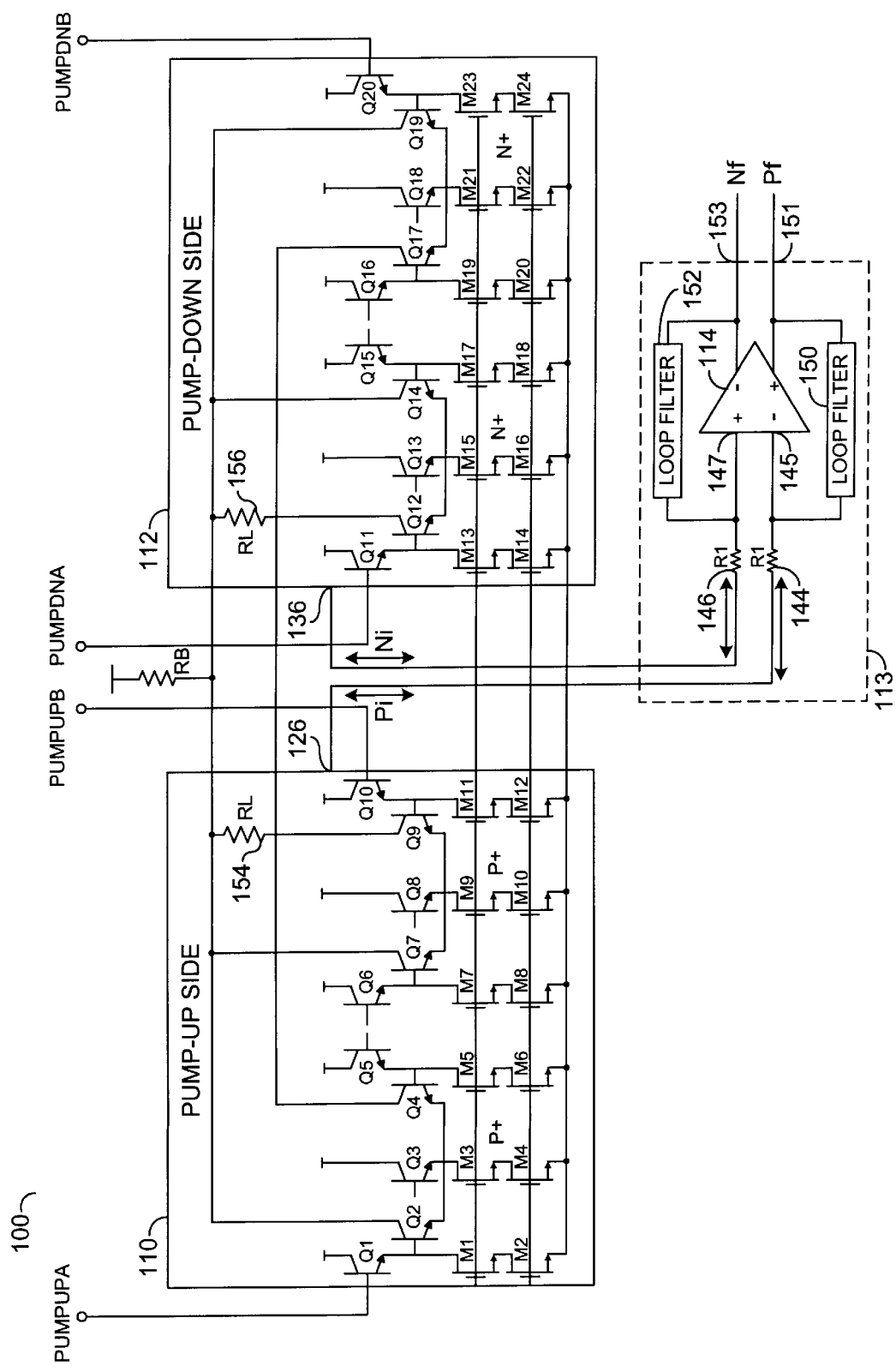
FIG. 9 is a circuit diagram of the embodiment of FIG. 8.

Referring to FIG. 9, a circuit diagram of the circuit 100 of FIG. 8 is shown. The pump-up circuit 110 generally comprises a number of transistors Q1–Q10 and a number of transistors M1–M12. The pump-down circuit 112 generally comprises a number of transistors Q11–Q20 and a number of transistors M13–M24. The transistors Q1–Q20 may be implemented, in one example, as bipolar junction transistors. The transistors M1–M24 may be implemented, in one example, as CMOS transistors. However, other transistor technologies may be used to implement the transistors Q1–Q20 and M1–M24 to meet the design criteria of a particular implementation.

The circuit 100 may generate the first current Pf and the second current Nf. The pump-up circuit 110 may provide the initial positive current Pi in response to the pump-up differential input PUMPUPA or PUMPUPB. The initial positive current Pi may be proportional to the pulse widths of the signal PUMPUPA or the signal PUMPUPB. The pump-down circuit 112 may provide the initial negative current Ni in response to the pump-down differential input PUMPDNA or PUMPDNB. The initial negative current Ni may be proportional to the pulse widths of the signal PUMPDNA or the signal PUMPDNB.

The initial positive current Pi (or negative current) may flow through a loop filter 150. The loop filter 150 may be connected between the resistor 144 and the output 151 of the output circuit 113. The initial positive current Pi (or negative current) is generally integrated onto a loop filter capacitor (not shown) of the loop filter 150 to form the first voltage Pf. The first voltage Pf may be presented to a voltage controlled oscillator (not shown). The initial negative current Ni (or positive current) may flow through a loop filter 152. The loop filter 152 may be connected between the resistor 146 and the output 151 of the output circuit 113. The initial negative current Ni (or positive current) is generally integrated onto a loop filter capacitor (not shown) of the loop filter 152 to form the second voltage Nf. The second voltage Nf may be presented to a voltage controlled oscillator (not shown).

The value of the first pulse of current Pf is generally based on a current division on the value of a tail current Pt through transistors M3 and M4 and M9 and M10 of the pump-up differential input and the ratio of the resistor 144 to the resistor 154 and the resistors 146 and 156. The current Pf may be defined by the following equation:

$$Pf = Pt * \text{resistor } 154 / (\text{resistors } 154 + 144 + 146 + 156) \quad \text{EQ1}$$

The transistors Q1–Q10 and Q11–Q20 may provide multiplexing as described in co-pending application Ser. No. 09/232,344, which is hereby incorporated by reference in its entirety. The multiplexing of the pump-up circuit 112 may involve the transistors Q3 and Q8. A base node of either transistor Q3 or Q8 is generally pulled to Vcc, which may cause the emitter of either the transistor Q3 or Q8 to be at one base-emitter voltage (Vbe) below Vcc. The pump-up circuit 112 may shunt all of the positive tail current Pt in the pump-up differential input through the pull-up transistor Q3 and away from the input/output 126 of the pump-up circuit 112, effectively disabling the pump-up differential input.

The value of the second current Nf is generally similar to the value of the first current. The value of the second current Nt is generally based on the value of a tail current Nf through transistors M13 and M14 and M21 and M22 in the pump-down differential input, and the ratio of resistor 146 to the resistor 156. The current Nf may be defined by the following equation:

$$Nf = Nt * \text{resistor } 156 / (\text{resistors } 154 + 144 + 156 + 146) \quad \text{EQ2}$$

The multiplexing of the pump-down circuit 114 may involve the transistors Q18 and Q13. The pump-down circuit 114 may shunt all the negative tail current Nt in the pump-down differential input through the pull-up transistor Q17 and away from the input/output 136 of the pump-down circuit 114, effectively disabling the pump-down differential input.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate a first current in response to a first differential input signal;
    a second circuit configured to generate a second current in response to a second differential input signal; and
    a third circuit configured to present a first pulse of current at a first output or a second pulse of current at a second output in response to said first and second currents, wherein said third circuit comprises (i) a first resistor coupled between said first current and a first input of said third circuit and (ii) a second resistor coupled between said second current and a second input of said third circuit.

2. The apparatus according to claim 1, wherein said first input signal and said second input signal are each pulse-width modulated logic signals.

3. The apparatus according to claim 1, wherein said first and second pulses of currents are pulse-width modulated pulses.

4. The apparatus according to claim 1, wherein:
    said first circuit comprises a first plurality of transistors and a second plurality of transistors; and
    said second circuit comprises a third plurality of transistors and a fourth plurality of transistors.

5. The apparatus according to claim 4, wherein said first and second plurality of transistors are configured to present said first current in response to said first input signal and said third and fourth plurality of transistors are configured to present said second current in response to said second input signal.

6. The apparatus according to claim 4, wherein said first plurality of transistors, said second plurality of transistors, said third plurality of transistors and said fourth plurality of transistors are implemented as CMOS transistors.

7. The apparatus according to claim 4, wherein said first and third plurality of transistors are bi-polar junction (BJT) transistors, and said second and fourth plurality of transistors are implemented as CMOS transistors.

8. The apparatus according to claim 7, wherein said second and fourth plurality of transistors are implemented as NMOS transistors.

9. The apparatus according to claim 1, wherein said third circuit further comprises (i) a first loop filter, (ii) a second loop filter and (iii) a comparator, wherein said first loop filter is connected to said first input and said first output and said second loop filter is connected to said second input and said second output.

10. The apparatus according to claim 7, wherein said apparatus comprises a high speed charge pump.

11. A circuit comprising:
   means for generating a first current in response to a first differential input signal pair;
   means for generating a second current in response to a second differential input signal pair; and
   means for generating a first pulse of current at a first output or a second pulse of current at a second output in response to (i) said first current and said second current and (ii) a first resistor coupled between said first current and a first input a second resistor coupled between said second current and a second input.

12. A method for generating a high current or a low current comprising the steps of:
   (A) generating a first current in response to a first differential input signal pair;
   (B) generating a second current in response to a second differential input signal pair; and
   (C) generating a first pulse of current at a first output or a second pulse of current at a second output in response to (i) said first current and said second current and (ii) a first resistor coupled between said first current and a first input and a second resistor coupled between said second current and a second input.

13. The method according to claim 12, wherein steps (B) and (C) generate said first and second pulses in response to (i) a first resistor coupled between said first current and a first input of said third circuit and (ii) a second resistor coupled between said second current and a second input of said third circuit.

14. The method according to claim 12, wherein said first and second input signals each comprise differential input pairs.

15. The method according to claim 12, wherein said first and second pulses of current each comprise pulse-width modulated pulses of current.

16. The apparatus according to claim 1, wherein:
   said first circuit further comprises a first multiplexer circuit configured to disable said first input signal in response to a supply voltage; and
   said second circuit further comprises a second multiplexer circuit configured to disable said second input signal in response to said supply voltage.

17. The apparatus according to claim 4, wherein:
   said first circuit further comprises a third resistor;
   said second circuit further comprises a fourth resistor;
   said first current pulse is proportional to said third resistor divided by a sum of said first resistor, said second resistor, said third resistor, and said fourth resistor; and
   said second current pulse is proportional to said fourth resistor divided by said sum of said first resistor, said second resistor, said third resistor, and said fourth resistor.

18. The apparatus according to claim 17, wherein (i) said first current pulse is further proportional to a first tail current generated by said second plurality of transistors and (ii) said second current pulse is further proportional to a second tail current generated by said fourth plurality of transistors.

* * * * *